United States Statutory Invention Registration [19]

[11] Reg. Number: H133

Huxsol et al. [45] Published: Sep. 2, 1986

[54] PRINTED WIRING BOARD CIRCUIT ISOLATOR TOOL

[75] Inventors: Robert D. Huxsol; Leon J. Snyder, both of Canoga Park, Calif.

[73] Assignee: The United States of America as represented by the Secretary of the Air Force, Washington, D.C.

[21] Appl. No.: 698,726

[22] Filed: Feb. 6, 1985

[51] Int. Cl.[4] ..... H05K 3/30

[52] U.S. Cl. ..... 29/832; 29/739; 228/264

[58] Field of Search ..... 29/739, 149.5 R; 228/19, 20, 269; 29/832

[56] References Cited

U.S. PATENT DOCUMENTS

| | | | |
|---|---|---|---|
| 3,222,766 | 12/1965 | Camargo . | |
| 3,376,630 | 4/1968 | Lempka | 29/149.5 R X |
| 3,521,678 | 7/1970 | Petree | 140/123 |
| 3,588,983 | 6/1971 | Hoy . | |
| 3,649,809 | 3/1972 | Halstead | 219/228 |
| 4,028,790 | 6/1977 | Dupuis | 29/764 |
| 4,168,569 | 9/1979 | Fairbairn | 29/764 |
| 4,409,732 | 10/1983 | Poff | 29/825 |

FOREIGN PATENT DOCUMENTS

| | | | |
|---|---|---|---|
| 2505241 | 8/1976 | Fed. Rep. of Germany | 228/264 |
| 1051447 | 12/1966 | United Kingdom | 228/264 |
| 1357066 | 6/1974 | United Kingdom | 228/264 |

OTHER PUBLICATIONS

Western Electric Tech Digest No. 55 Jul. 1979 p. 25 by Rapp.

*Primary Examiner*—Harold J. Tudor
*Attorney, Agent, or Firm*—Donald J. Singer; Richard J. Donahue

[57] ABSTRACT

A tool for isolating a printed circuit wiring trace from a component pin, said tool having a rotatable shank with an internal cavity and external cutting flutes formed on an end thereof. The end of the tool is pushed over the exposed end of the pin such that the cutting flutes bear against the solder material which bridges the gap between the printed wiring trace and the component pin. The tool is then rotated to remove the solder bridge and any underlying wiring trace material to isolate the wiring trace and pin from each other.

6 Claims, 1 Drawing Figure

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

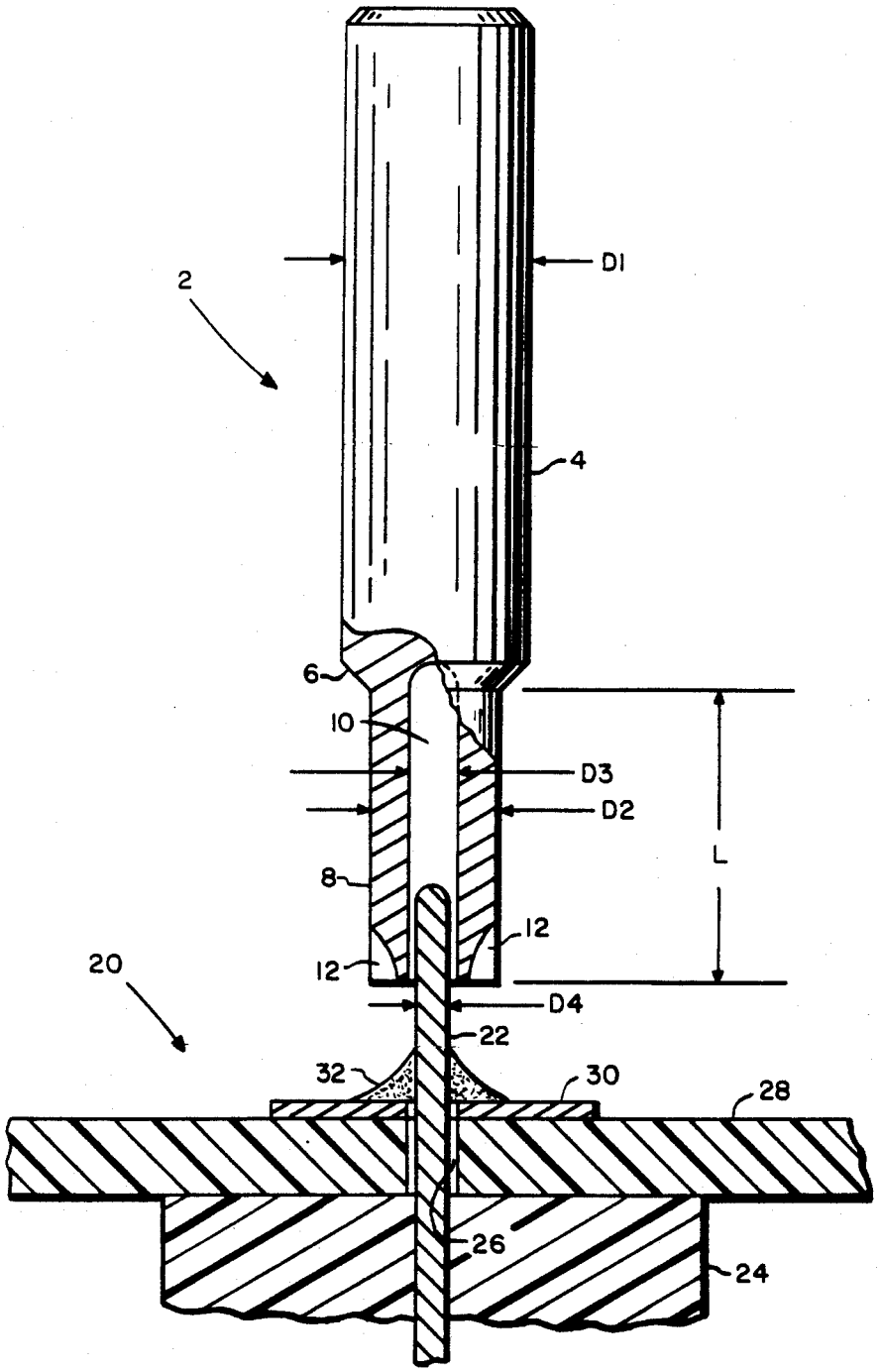
2
D1
4
6
10
D3
D2
L
8
12
12
20
D4
22
32
30
28
26
24

PRINTED WIRING BOARD CIRCUIT ISOLATOR TOOL

STATEMENT OF GOVERNMENT INTEREST

The invention described herein may be manufactured and used by or for the Government for governmental purposes without the payment of any royalty thereon.

BACKGROUND OF THE INVENTION

The present invention is directed to a tool for electrically isolating circuitry on a printed wiring board from a component pin after the pin has been soldered in place on the board.

The concept of transferring signals to and from conductive foil strips (often called traces) formed on a printed circuit board, by way of connectors having their pins soldered to the traces, is old and well-established. Usually the end of a trace is enlarged to form a metallic pad having a hole therethrough which accepts a connector pin. The pin is soldered to the trace to provide an electrical connection and mechanical bond therebetween.

It is often the case that after a printed wiring board has been fabricated, and components, (such as connectors and other components having rigid metallic terminals posts or pins) have been mounted thereon and soldered thereto, system design changes, are made which necessitate the isolation of circuitry from a particular component pin or pins. One method for accomplishing this end is to unsolder the component pin or pins, remove the component, enlarge the hole and reinstall the component. This method is time consuming and involves the risk of damaging the board. In some instances, it may be possible to remove the pin and drill a hole elsewhere in the board to accept a new pin, but this method is not always possible if the board is densely packed or if the component pin must be at a precise location on the board.

OBJECTS AND SUMMARY OF THE INVENTION

It is therefore an object of the present invention to provide a new and improved tool for isolating printed wiring circuitry from a component pin.

It is another object of the present invention to provide a tool of the general character described above which is easy and economical to manufacture, which is rugged and durable, which is highly effective and dependable in operation, and which may be quickly and easily employed for isolating printed circuit wiring from a connector or other component pin.

In accordance with these and other objects, a tool for isolating printed wiring from component pins includes a rotatable shank having an internal cavity and external cutting flutes formed on an end thereof. The end of the tool is pushed over the exposed end of a pin such that the cutting flutes bear against the solder material which bridges the gap between the printed wiring trace and the component pin. The tool is then rotated to remove the bridge of solder material and the underlying conductor trace material to isolate the trace and pin from each other.

The foregoing and other objects, features and advantages of the present invention will become apparent as the description thereof proceeds when considered in connection with the accompanying illustrative drawing.

BRIEF DESCRIPTION OF THE DRAWING

The sole FIGURE of the drawing is a partially sectioned front view of the circuit isolator tool of the present invention, and a sectioned portion of a typical printed wiring board having a connector pin thereon.

DETAILED DESCRIPTION OF THE INVENTION

Referring now the the accompanying drawing in detail, the circuit isolator tool of the invention is designated generally by the reference number 2. The tool 2 is generally cylindrical in shape and is illustrated with a section taken through part of the longitudinal axis thereof. It has a shank 4 having a tapered portion 6 which reduces its outer diameter D1 to diameter D2 at the end 8 thereof. A internal cavity 10 of diameter D3 is formed in end 8 of shank 4 and cutting flutes 12 are formed on the external surface of the end 8 of shank 4.

The drawing also illustrates a portion of a typical printed circuit or wiring board 20 shown in a section taken through the longitudinal diameter of a pin 22 emanating from a component 24 installed thereon. Component 24 may be a connector, including a multipin connector, or may be any electronic device having rigid pins. Pin 22 of component 24 is inserted through an aperture or hole 26 formed through the insulative substrate 28 of printed wiring board 20.

Reference numeral 30 designates a metallic foil conductor or trace formed on the substrate 28 of printed wiring board 20. Trace 30 surrounds hole 26 and has a hole therethrough of substantially the same diameter as the hole 26. Pin 22 is retained in printed wiring board 20 by solder material 32 which bridges the pin 22 and wiring trace conductor 30 thus providing a mechanical and electrical bond therebetween.

In instances, as described earlier, where it becomes desireable to isolate pin 22 from conductor 30, end 8 of isolator tool 2 is pushed over the exposed extremity of pin 22 such that pin 22 slides within hole 10 which forms a receptacle therefor. Tool 2 is then rotated and cutting flutes 12 remove solder 32 bridging the gap between pin 22 and conductor 30, as well as any portion of conductor 30 lying below the cutting flutes 12. Since pin 22 is now electrically isolated from conductor 30, it is now possible to apply different circuitry to pin 22, as by soldering a jumper wire thereto.

The preferred embodiment of the present invention described herein has been constructed wherein shank diameter D2 is 0.060 inches, hole 10 has a diameter D3 of 0.030 inches and the end 8 of shank 2 has a length L of 0.180 inches.

The diameter D1 of tool 2 is not critical in most applications and is preferrably given a dimension which will fit into the chuck of a T-bar wrench, electric drill, or milling machine.

Although the invention has been described with reference to a particular embodiment, it will be understood to those skilled in the art that the invention is capable of a variety of alternative embodiments within the spirit and scope of the appended claims.

What is claimed is:

1. A tool for isolating circuitry foil conductors formed on the surface of a printed wiring board from component pins inserted in said board and soldered to said conductors, said tool comprising:

a rotatable shank having a first and a second end;

a receptable means formed at said first end of said shank for receiving the extremity of a pin protruding through said board and soldered to a conductor disposed on the surface of said board nearest said extremity of said pin; and cutting means formed on said first end of said shank for removing metallic material on said board electrically connecting said pin and said conductor.

2. A tool of the type described in claim 1 wherein said receptacle means comprises a cylindrical cavity in said first end of said shank and coaxial with the longitudinal axis of said shank.

3. A tool of the type described in claim 2 wherein said cutting means comprises cutting flutes formed on the exterior surface of said first end of said shank.

4. A tool of the type described in claim 3 wherein said cutting flutes terminate at an angle substantially normal to the longitudinal axis of said shank of said tool.

5. A tool of the type described in claim 4 wherein said conductor comprises metallic foil material encircling said pin.

6. A method for isolating the pin of a component soldered to a foil conductor of a printed circuit board, said method using a tool having a pin receptacle and cutting flutes at an end of the shank thereof, said method comprising the steps of:

pushing said end of said tool onto said pin to enclose the extremity of said pin within said pin receptacle; and simultaneously forcing said end of said tool against said conductor and rotating said shank of said tool to cause said cutting flutes to remove metallic material on said board surrounding said pin below said tool.

* * * * *